United States Patent
Cai

(10) Patent No.: US 8,324,042 B2
(45) Date of Patent: Dec. 4, 2012

(54) INTEGRATED COMPLEMENTARY LOW VOLTAGE RF-LDMOS

(75) Inventor: Jun Cai, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 37 days.

(21) Appl. No.: 13/005,593

(22) Filed: Jan. 13, 2011

(65) Prior Publication Data
US 2011/0104861 A1 May 5, 2011

Related U.S. Application Data

(60) Division of application No. 12/553,464, filed on Sep. 3, 2009, now Pat. No. 7,888,735, which is a continuation of application No. 11/619,828, filed on Jan. 4, 2007, now abandoned, which is a continuation-in-part of application No. 11/551,887, filed on Oct. 23, 2006, now Pat. No. 7,649,225, which is a division of application No. 10/893,519, filed on Jul. 15, 2004, now Pat. No. 7,125,777.

(51) Int. Cl.
*H01L 21/336* (2006.01)

(52) U.S. Cl. .. 438/231; 438/286; 438/305; 257/E21.417

(58) Field of Classification Search .................. 438/199, 438/217, 229–233, 286, 299, 301–303, 305–307; 257/E21.417
See application file for complete search history.

(56) References Cited

U.S. PATENT DOCUMENTS

| 4,994,904 | A | 2/1991 | Nakagawa et al. |
| 5,146,298 | A | 9/1992 | Eklund |
| 5,264,719 | A | 11/1993 | Beasom |
| 5,304,827 | A | 4/1994 | Malhi et al. |
| 5,314,834 | A | 5/1994 | Mazure |

(Continued)

FOREIGN PATENT DOCUMENTS
EP    0 880 183 A    11/1998

OTHER PUBLICATIONS

EP Search Report from European Patent Appl. No. EP 05 77 2270 dated Jan. 13, 2009 (total 8 pgs.).

(Continued)

*Primary Examiner* — Marcos D. Pizarro
(74) *Attorney, Agent, or Firm* — Hiscock & Barclay, LLP

(57) ABSTRACT

Complementary RF LDMOS transistors have gate electrodes over split gate oxides. A source spacer of a second conductivity type extends laterally from the source tap of a first conductivity type to approximately the edge of the gate electrode above the thinnest gate oxide. A body of a first conductivity type extends from approximately the bottom center of the source tap to the substrate surface and lies under most of the thin section of the split gate oxide. The source spacer is approximately the length of the gate sidewall oxide and is self aligned with gate electrode. The body is also self aligned with gate electrode. The drain is surrounded by at least one buffer region which is self aligned to the other edge of the gate electrode above the thickest gate oxide and extends to the below the drain and extends laterally under the thickest gate oxide. Both the source tap and drain are self aligned with the gate side wall oxides and are thereby spaced apart laterally from the gate electrode.

21 Claims, 10 Drawing Sheets

U.S. PATENT DOCUMENTS

| | | |
|---|---|---|
| 5,366,915 A | 11/1994 | Kodama |
| 5,741,737 A | 4/1998 | Kachelmeier |
| 5,920,776 A * | 7/1999 | Fratin et al. .................. 438/257 |
| 6,110,783 A | 8/2000 | Burr |
| 6,127,696 A | 10/2000 | Sery et al. |
| 6,168,999 B1 | 1/2001 | Xiang et al. |
| 6,240,267 B1 | 5/2001 | Compera |
| 6,297,108 B1 | 10/2001 | Chu |
| 6,307,233 B1 | 10/2001 | Awaka et al. |
| 6,365,932 B1 | 4/2002 | Kouno et al. |
| 6,372,586 B1 | 4/2002 | Efland et al. |
| 6,441,431 B1 | 8/2002 | Efland et al. |
| 6,441,432 B1 | 8/2002 | Sumida |
| 6,489,203 B2 | 12/2002 | Cai |
| 6,593,621 B2 | 7/2003 | Tsuchiko et al. |
| 6,620,656 B2 | 9/2003 | Min |
| 6,717,850 B1 | 4/2004 | Li et al. |
| 6,734,496 B2 | 5/2004 | Fujihira |
| 6,864,140 B2 | 3/2005 | Bryant |
| 6,888,182 B2 | 5/2005 | Mitani |
| 6,888,205 B2 * | 5/2005 | Moscatelli et al. ........... 257/406 |
| 6,933,560 B2 | 8/2005 | Lee et al. |
| 2002/0063263 A1 * | 5/2002 | Scott et al. .................... 257/200 |
| 2003/0085448 A1 | 5/2003 | Cai |
| 2003/0228730 A1 | 12/2003 | Efland et al. |

OTHER PUBLICATIONS

International Search Report and Written Opinion from PCT Appl. No. PCT/US07/89203 (6 pgs.).

Motorola NCSG; Semiconductor Technologies for RF Power; 2002 (32 pgs.).

Mohapatra, Nihar R., et al., A Complementary RF-LDMOS Architecture Compatible with 0.13 um CMOS Technology; Proceedings of the 18th International Symposium on Power Semiconductor Devices & ICs, Jun. 4-8, 2006 (4 pgs.).

* cited by examiner

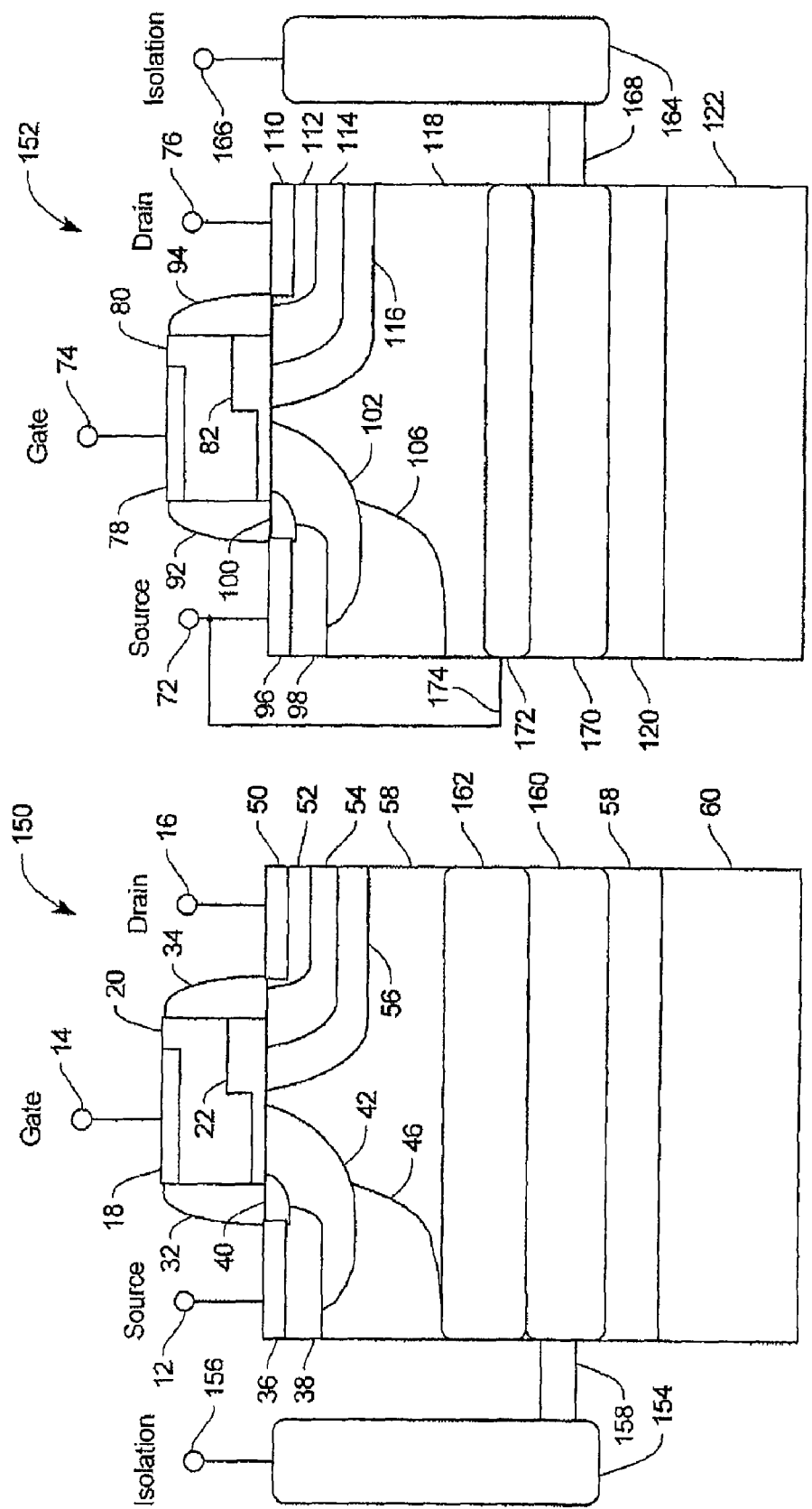

INTEGRATED COMPLEMENTARY LOW VOLTAGE RF-LDMOS

CROSS-REFERENCE TO RELATED APPLICATIONS

This application is a divisional of U.S. patent application Ser. No. 12/553,464 filed Sep. 3, 2009 now U.S. Pat. No. 7,888,735, which is a continuation of U.S. patent application Ser. No. 11/619,828 filed Jan. 4, 2007 now abandoned and which is a continuation-in-part of U.S. patent application Ser. No. 11/551,887 filed Oct. 23, 2006 (now issued U.S. Pat. No. 7,649,225), which is a divisional of U.S. patent application. Ser. No. 10/893,519, filed Jul. 15, 2004 (now issued U.S. Pat. No. 7,125,777). All applications are hereby incorporated by reference.

FIELD OF THE INVENTION

This invention relates to power MOSFETs, and more particularly, to low power lateral complementary power MOSFETs.

BACKGROUND OF THE INVENTION

The widespread use of personal communication products, such as cell phones and wireless LANs, has created a demand for semiconductor devices which can provide certain operational characteristics specific to these devices. One of these operational characteristics relates to the power dissipated in the semiconductor devices. The conventional method to reduce the power dissipation is to use a power supply voltage of three volts or less. However, certain portions of the electronics, such as the RF transmitters, require power devices that can handle higher voltages and currents than are not present in the rest of the electronic circuitry. This requirement is exacerbated by the demand for ever smaller products thus providing a strong incentive for combining complementary power devices on the same substrate as other portions of the electronics. The lateral double diffused MOSFET (LDMOS) transistor is virtually the only silicon device to meet these requirements.

LDMOS transistors know in the art usually use a drift region to provide the relatively high breakdown voltages required of these devices. However such drift regions increase device resistance and take up space on a semiconductor chip thus requiring a significantly larger chip area than needed for convention MOSFETs.

In addition, most of these prior art LDMOS transistors have relatively low DC transconductance that also is significantly degraded in the frequency ranges used in many of the personal communication products, have power loss in the device due to capacitances, junction leakage and substrate loss, and can have reliability problems arising from the hot carrier effect.

Therefore, it can be appreciated that a LDMOS transistor which can provide improvements in some or all of these areas over the currently known LDMOS transistors is highly desirable.

SUMMARY OF THE INVENTION

The invention comprises, in one form thereof, a lateral double diffused metal oxide semiconductor (LDMOS) transistor comprising a gate oxide having a plurality of thicknesses under a gate electrode, a lateral spacer of a second conductivity type lying between a first edge of the gate electrode and a source tap region of a first conductivity type, the second conductivity type being opposite to the first conductivity type, and a drain region of the second conductivity type having a at least one buffer region which at least partially surrounds the drain region and which extends under a second edge of the gate electrode.

In another form, the invention includes a method for making a LDMOS transistor. The method comprises the steps of growing an epi layer on a substrate, forming a gate electrode on a split gate oxide formed on the epi layer, forming a body of a first conductivity type using a first side of the gate electrode as a mask, forming a shallow source spacer region of a second conductivity type using the first edge of the gate electrode as a mask, the second conductivity type being opposite to the first conductivity type, forming at least one buffer layer of the second conductivity type using a second edge of the gate electrode as a mask, forming first and second side wall oxides on the first and second edges, respectively, of the gate electrode, and forming a source tap layer of the first conductivity type using the first side wall oxide as a mask such that the source tap layer and the body overlap in a region spaced away from the first edge of the gate electrode, the source spacer region extending from the source tap layer to at least the first edge of the gate electrode.

BRIEF DESCRIPTION OF THE DRAWINGS

The features and advantages of this invention, and the manner of attaining them, will become apparent and be better understood by reference to the following description of the various embodiments of the invention in conjunction with the accompanying drawings, wherein:

FIG. 7A is a diagrammatic view of an n channel integrated low voltage RF-LDMOS transistor according to still another embodiment of the present invention;

FIG. 7B is a diagrammatic view of a complementary p channel version of the integrated low voltage RF-LDMOS transistor shown in FIG. 7A;

FIG. 8C is a graph of the drain characteristics versus drain voltage simulation of a prior art transistor;

Figure 1A:
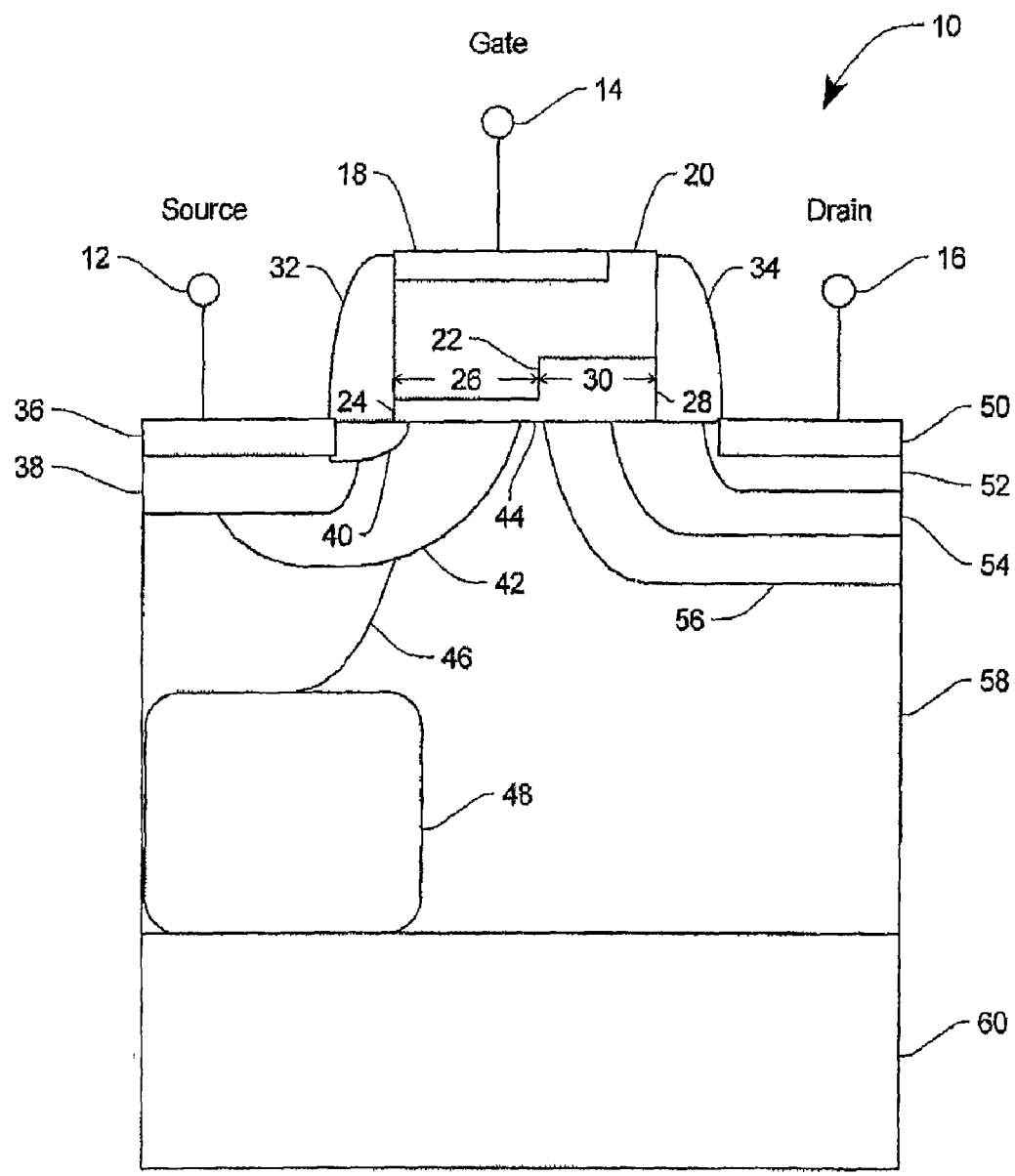
FIG. 1A is a diagrammatic view of an n channel integrated low voltage RF-LDMOS transistor according to an embodiment of the present invention.

It will be appreciated that for purposes of clarity, and where deemed appropriate, reference numerals have been repeated in the figures to indicate corresponding features. Also, the relative size of various objects in the drawings has in some cases been distorted to more clearly show the invention. The examples set out herein illustrate several embodiments of the invention but should not be construed as limiting the scope of the invention in any manner.

DETAILED DESCRIPTION

Turning now to the drawings, FIG. 1A is a diagrammatic view of an n channel integrated complementary low voltage RF-LDMOS transistor 10 according to an embodiment of the present invention. The transistor 10 has a source connection 12, a gate connection 14, and a drain connection 16. The gate connection 14 is electrically connected to a gate silicide 18 formed in a gate polysilicon 20. The gate polysilicon 20 has a stepped bottom layer lying over a split gate oxide 22 with a thin section 24 of length 26, and a thick section 28 of length 30. A sidewall oxide 32 is shown on the left side of the gate silicide 18, the gate polysilicon 20, and the thin section 24 of the split gate oxide 22. Similarly, a sidewall oxide 34 is shown on the right side of the gate polysilicon 20 and the thick section 28 of the split gate oxide 22.

The source connection 12 is electrically connected to a source silicide 36 under which is a source P+ tap 38. A shallow and short N+ source spacer 40 extends laterally from the right edge of the source silicide 36 and top right of the P+ tap 38 to slightly under the left side of the gate polysilicon 20. The length of the N+ source spacer 40 in one embodiment of the invention is approximately 0.08 microns, and can be between 0.04 and 0.3 microns. A P body 42 extends from the approximately the bottom center of the P+ tap 38 to the substrate surface 44 and lies under most of the thin section 24 of the split gate oxide 22. A P– well 46 extends from the top of an optional P– buried layer 48 from approximately the downward projection of the middle of the bottom of the P+ tap 38 to the bottom of the P body 42 at a point approximately below the left edge of the gate polysilicon 20.

The drain connection 16 is electrically connected to a drain silicide 50. A N+ drain 52 lies under and extends to the left of the drain silicide 50. The left end of the N+ drain is spaced laterally apart from the gate polysilicon 20. A N buffer layer 54 lies under the N+ drain 52 and extends latterly to about the middle of the thick section 28 of the split gate oxide 22. A N– buffer layer 56 lies under the N buffer layer 54 and extends to under all of the thick section 28 of the split gate oxide 22 near the transition of the thin section 24 to the thick section 28 of the split gate oxide 22.

The source silicide 36 and the drain silicide 50, and the doped regions described above all lie in an epi layer 58 which in turn is atop a P+ substrate 60.

The RF-LDMOS transistor 10 has a minimum device geometry for power LDMOS transistors and is made by utilizing self-aligned architecture design for high speed requirements. The self-aligned architecture will be explained in more detail below with reference to FIGS. 2A through 4B. The transistor 10 has a zero drift length which helps to minimize the device geometry.

Besides miniaturization, the transistor 10 has several characteristics arising from the geometry of the device which provide important operating parameters. The shallow N+ source spacer 40 with the P body 42 underneath and the P+ tap provide a large Safe Operating Area (SOA), a small input capacitance, and little junction leakage (which is important in battery powered hand-held applications). The combination of the P body 42, the P– well 46, the P– buried layer 48, and the P+ substrate 60 provide reduced substrate self-heating which minimizes the substrate loss. The split gate oxide 22 provides a lessened Miller feedback capacitance since the gate-drain overlap is located at the thick section 28 of the split gate oxide 22 thereby lowering the Crss. The split gate oxide also provides a large transconductance and lower Vt since the effective channel is located at the thin oxide section 24 having an effective channel length shorter that the width of the gate polysilicon 20. The thick gate oxide section 28 on the drain side lowers the E-field to thereby increase the breakdown voltage of the transistor 10. The N buffer layer 54 and the N– buffer layer 56 step drain buffers together with the P– epi provide a large depletion width which lowers the drain to source capacitance $C_{ds}$. The step drain buffers lessen the degradation of $R_{on}$, $g_m$ and $I_{Dsat}$ since the N– buffer layer 56 with significant overlap with the thick gate oxide section 28 allows the channel electrons to spread out deep away from the gate oxide 22 resulting in fewer filled traps in the gate oxide 22. The lessening of the degradation of $R_{on}$, $g_m$ and $I_{Dsat}$ therefore increases the reliability of the transistor 10. Finally, the zero drift length combined with the relatively highly doped N buffer layer 54, which extends underneath the sidewall spacer 34, provides a low $R_{on}$ and low conduction loss.

Figure 1B:
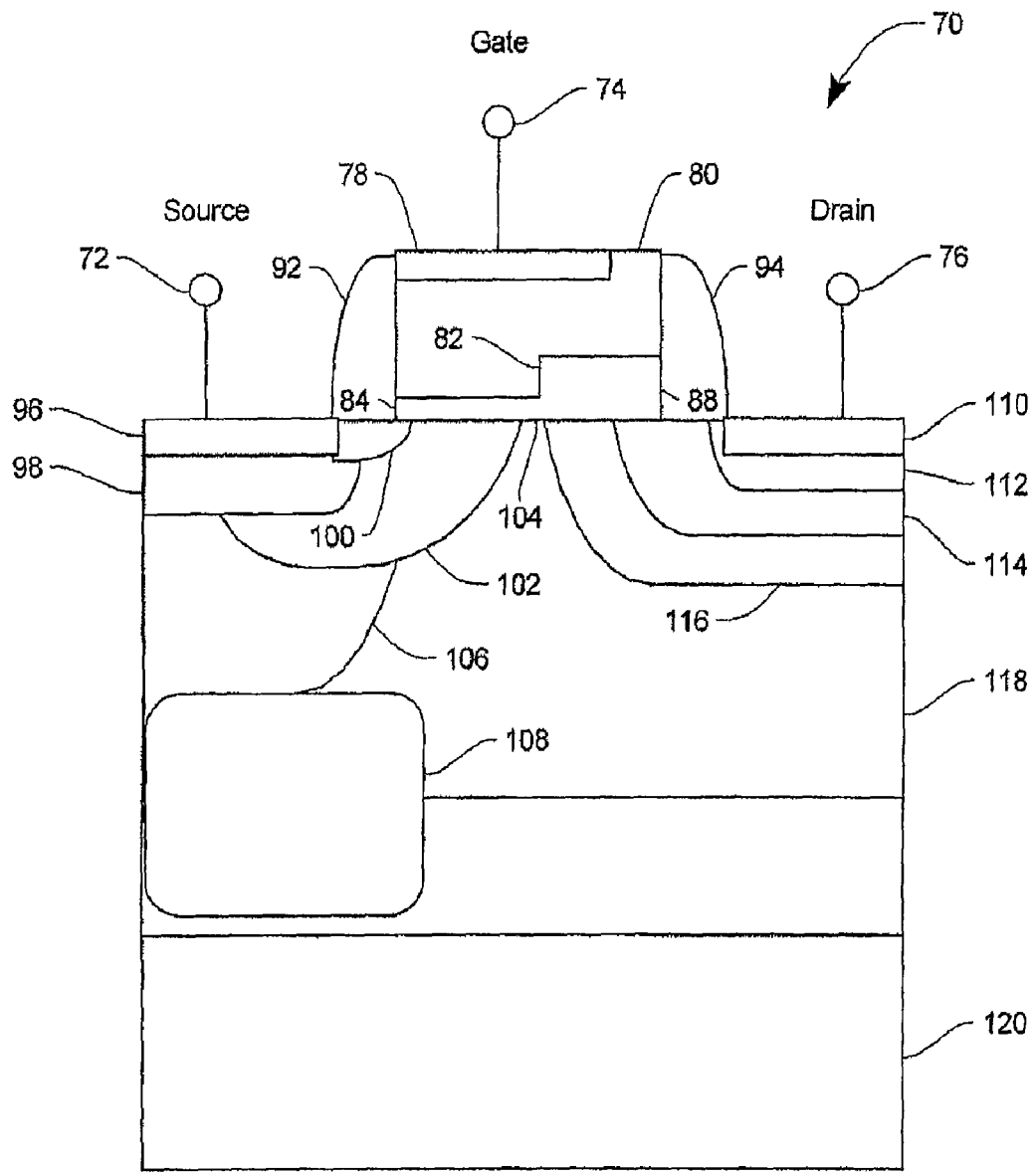
FIG. 1B is a diagrammatic view of a complementary p channel version of the integrated low voltage RF-LDMOS transistor shown in FIG. 1A.

FIG. 1B is a diagrammatic view of a complementary p channel version 70 of the integrated low voltage RF-LDMOS transistor shown in FIG. 1A. Transistor 70 has a source connection 72, a gate connection 74, and a drain connection 76. The gate connection 74 is electrically connected to a gate silicide 78 formed in a gate polysilicon 80. The gate polysilicon 80 has a stepped bottom layer lying over a split gate oxide 82 with a thin section 84 and a thick section 88. A sidewall oxide 92 is shown on the left side of the gate silicide 78, the gate polysilicon 80, and the thin section 84 of the split gate oxide 82. Similarly, a sidewall oxide 94 is shown on the right side of the gate polysilicon 80 and the thick section 88 of the split gate oxide 82.

The source connection 72 is electrically connected to a source silicide 96 under which is a source N+ tap 98, a shallow and short P+ source spacer 100 extends laterally from the right edge of the source silicide 96 and top right of the N+ tap 98 to slightly under the left side of the gate polysilicon 80. A N body 102 extends from the approximately the bottom center of the N+ tap 88 to the substrate surface 104 and lies under most of the thin section 84 of the split gate oxide 82. A N– well 106 extends from the top of an optional N– buried layer 108 from approximately the downward projection of the middle of the bottom of the N+ tap 98 to the bottom of the N body 102 at a point approximately below the left edge of the gate polysilicon 80.

The drain connection 76 is electrically connected to a drain silicide 110. A P+ drain 112 lies under and extends to the left of the drain silicide 110. The left end of the P+ drain is spaced laterally apart from the gate polysilicon 80. A P buffer layer 114 lies under the P+ drain 112 and extends latterly to about the middle of the thick section 88 of the split gate oxide 82. A P– buffer layer 116 lies under the P buffer layer 114 and extends latterly to under all of the thick section 88 of the split gate oxide 82 near the transition of the thin section 84 to the thick section 88 of the split gate oxide 82.

The source silicide 96 and the drain silicide 110, and the doped regions described above all lie in a high voltage N– well 118 which in turn is partially atop the N– buried layer 108, which are in turn atop a P– epi 120 which is atop a P+ substrate 122.

The characteristics described above for the N channel transistor 10 also apply to the P channel transistor 70.

Figure 2A:
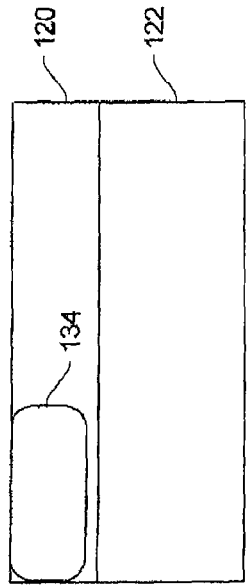
FIG. 2A is a diagrammatic view of an early stage in the fabrication of the transistor shown in FIG. 1A.
Figure 2B:
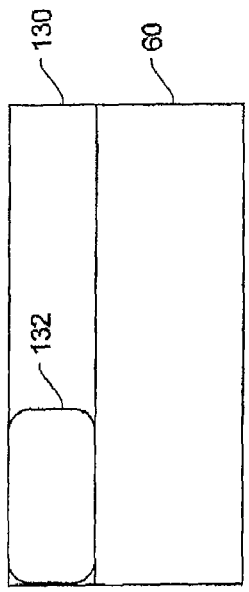
FIG. 2B is a diagrammatic view of an early stage in the fabrication of the transistor shown in FIG. 1B.

FIGS. 2A and 2B are diagrammatic views of an early stage in the fabrication of the transistors 10 and 70, respectively. In FIG. 2A a starting P– epi 130 is formed on the P+ substrate 60. A P– buried layer 132 is formed in the P– epi 130. Similarly, in FIG. 2B the starting P– epi 120 is formed on the P+ substrate 122, and a buried layer 134 is formed in the P– epi 120.

Figure 3A:
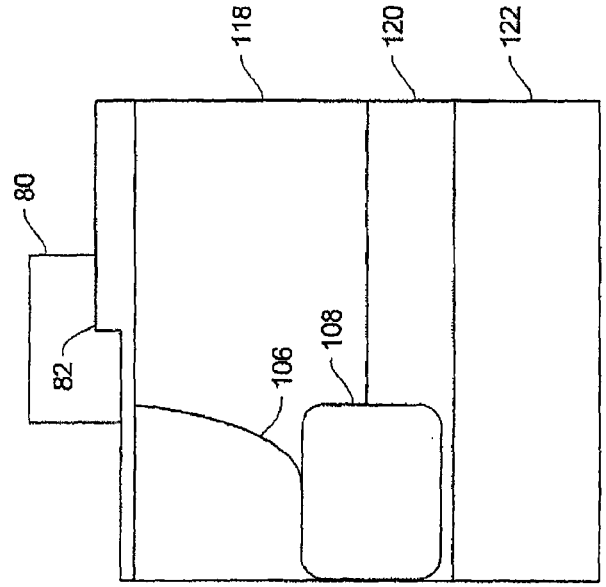
FIG. 3A is a diagrammatic view of an intermediate stage in the fabrication of the transistor shown in FIG. 1A.
Figure 3B:
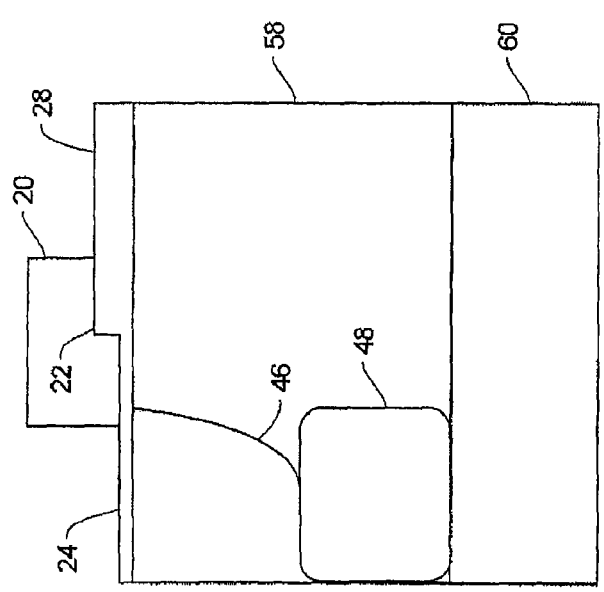
FIG. 3B is a diagrammatic view of an intermediate stage in the fabrication of the transistor shown in FIG. 1B.

FIGS. 3A and 3B are diagrammatic views of an intermediate stage in the fabrication of the transistors 10 and 70, respectively. In FIG. 3A an additional in-line P– epi is grown on the P– buried layer 132 and P– epi 130 of FIG. 2A to form the P– epi 58 shown in FIG. 1A. After field oxidation and masking, the P– well 46 is implanted. In a subsequent diffusion operation the P– buried layer 132 of FIG. 2A diffuses upward to form the P– buried layer 48, and the P– well 46 diffuses downwardly and laterally. The split gate oxide 22 is formed on the top of the P– epi 58 and the gate polysilicon 20 is placed across the junction of the thick gate oxide 28 and the thin gate oxide 24. In FIG. 3B, similar to FIG. 3A, the high voltage N– well 118 is implanted and diffused in an additional in-line P– epi 118. The N– well 106 is formed in the same manner as the P– well 46 shown in FIG. 3A. In a subsequent diffusion operation the N– buried layer 134 is diffused upward to form the N– buried layer 108, and the N– well 106 diffuses downwardly and laterally at the same time. The split gate oxide 82 and the gate polysilicon 80 are formed in the same manner as in the n channel transistor shown in FIG. 3A.

Figure 4B:
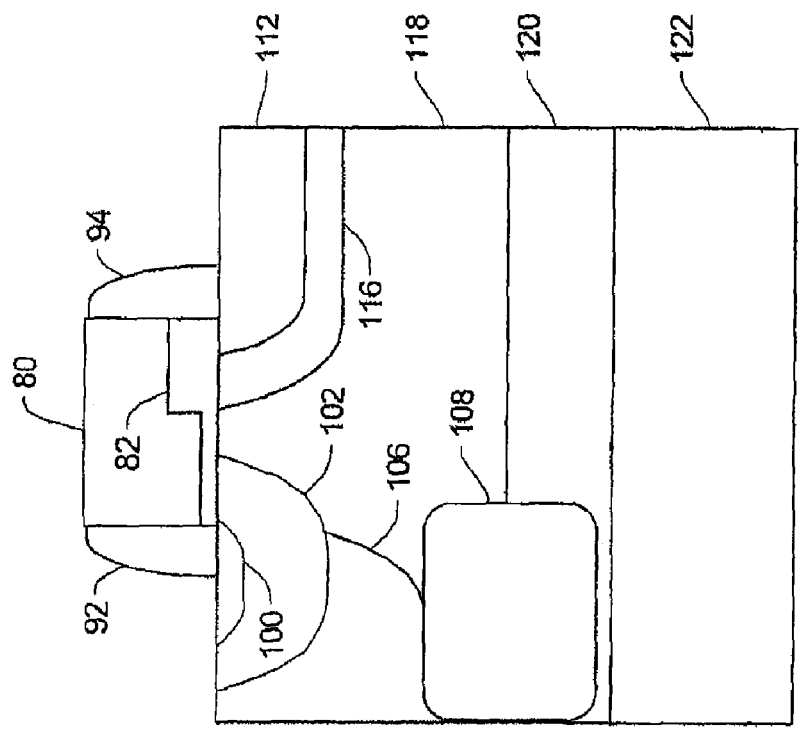
FIG. 4B is a diagrammatic view of a later intermediate stage in the fabrication of the transistor shown in FIG. 1B.
Figure 4A:
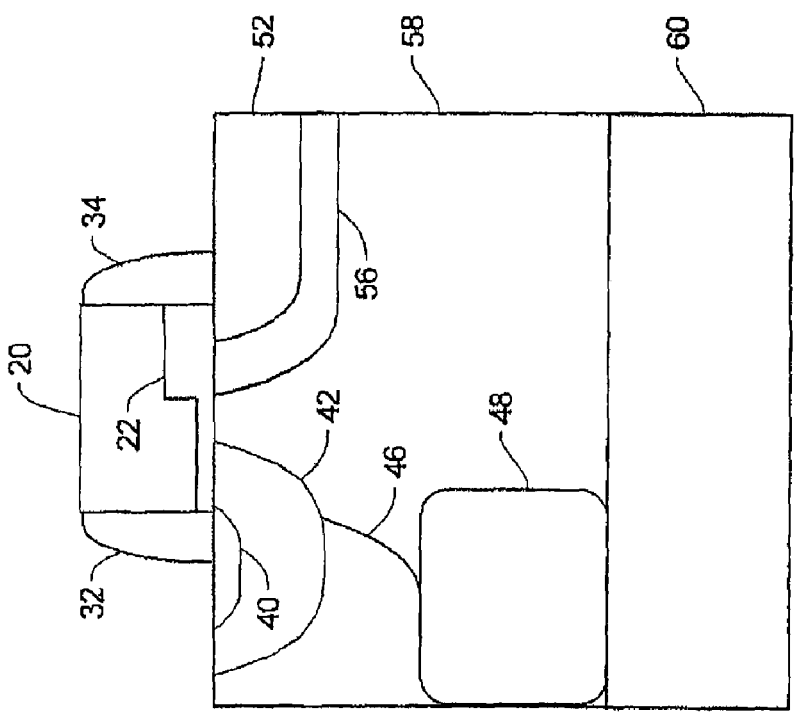
FIG. 4A is a diagrammatic view of a later intermediate stage in the fabrication of the transistor shown in FIG. 1A.

FIGS. 4A and 4B are diagrammatic views of a later intermediate stage in the fabrication of the transistors 10 and 70, respectively. In FIG. 4A the P body 42 and the N+ source spacer 40 are implanted using the same mask and are self-aligned to the left side of the gate polysilicon 20. Similarly, the step drain buffers consisting of the N– buffer layer 56 and the N buffer layer 52 are implanted using the same mask and are self-aligned to the right side of the gate polysilicon 20. The same operations are performed for the p channel transistor shown in FIG. 4B with complementary dopant types. After bodies 42, 102 and source spacers 40, 100 are formed, the sidewall oxide 32, 34, 92, and 94 are made using a standard oxide spacer process.

The transistor 10 shown in FIG. 1A is completed by implanting the P+ body tap 38, which is self-aligned to the left side wall oxide, forming the source silicide 36 using the left side wall oxide 32 as a mask, implanting the N+ drain 52, which is self-aligned to the right side wall oxide, and forming the drain silicide 50 using the right side wall oxide 34 as a mask. The transistor 70 shown in FIG. 1B is completed in the same manner using complementary dopant types.

Figure 5B:
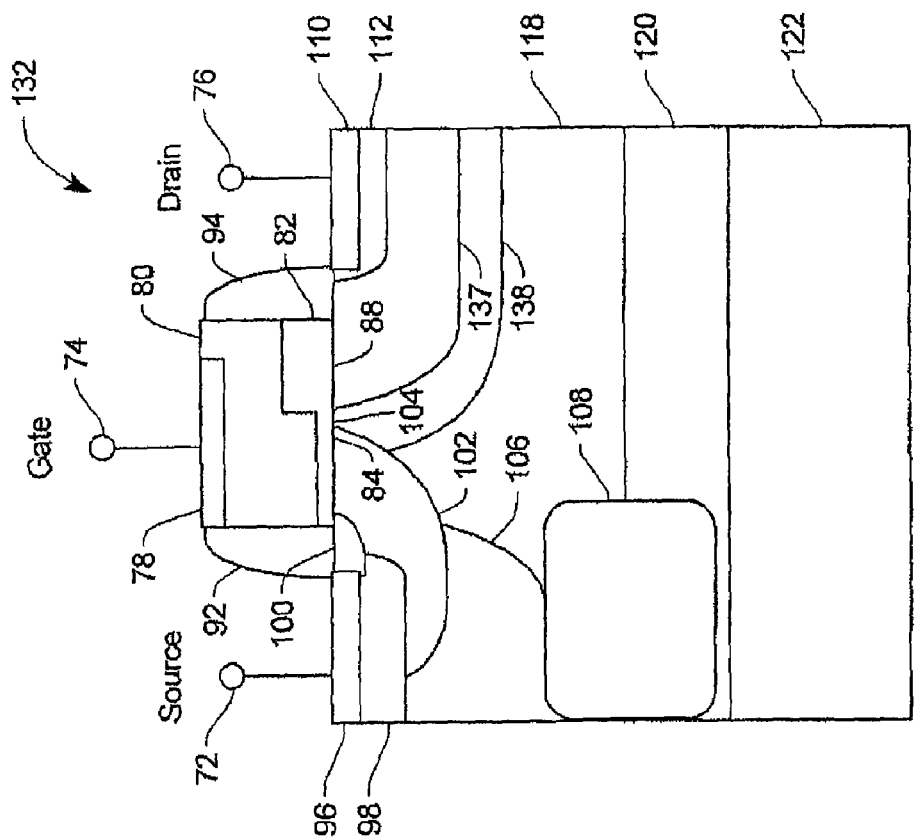
FIG. 5B is a diagrammatic view of a complementary p channel version of the integrated low voltage RF-LDMOS transistor shown in FIG. 5A.
Figure 5A:
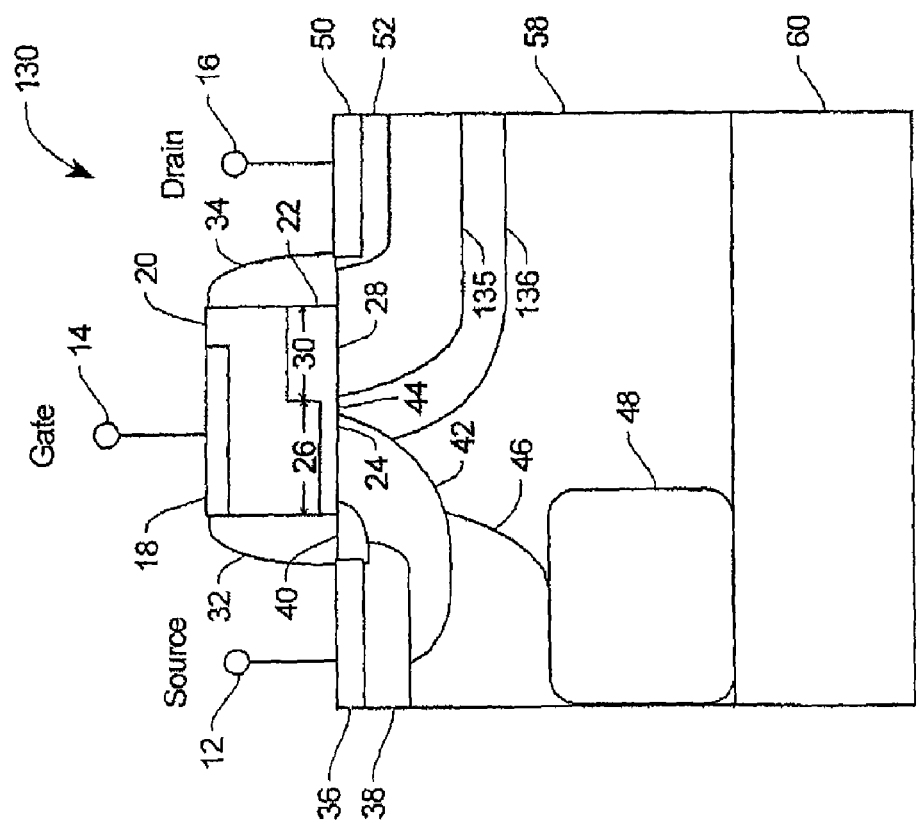
FIG. 5A is a diagrammatic view of an n channel integrated low voltage RF-LDMOS transistor according to another embodiment of the present invention.

FIGS. 5A and 5B are diagrammatic views of integrated low voltage RF-LDMOS transistors 130 and 132, respectively, according to another embodiment of the present invention. Transistor 130 is transistor 10 with an enlarged N buffer layer 135 instead of the N buffer layer 54, and a P– buffer layer 136 instead of the N– buffer layer 56; and transistor 132 is transistor 70 with an enlarged P buffer layer 137 instead of the P buffer layer 114, and a N– buffer layer 138 instead of the P– buffer layer 116. In this embodiment 130 of the present invention, the N buffer 132 extends latterly to under the thick section 28 of the split gate oxide 22 near the transition of the thin section 24 to the thick section 28 of the split gate oxide 22, and the P– buffer 134 extends latterly and deeply under all of the thick section 28 and part of the thin section 24 to overlap the P body 42. The transistor 132 shown in FIG. 5B is formed in the same manner using complementary dopant types. The change from N– buffer to P– buffer in transistor 130 or from P– buffer to N– buffer in transistor 132 is to increase the device drain to source punch-through voltage which can be a problem with very short channel devices.

Figure 6B:
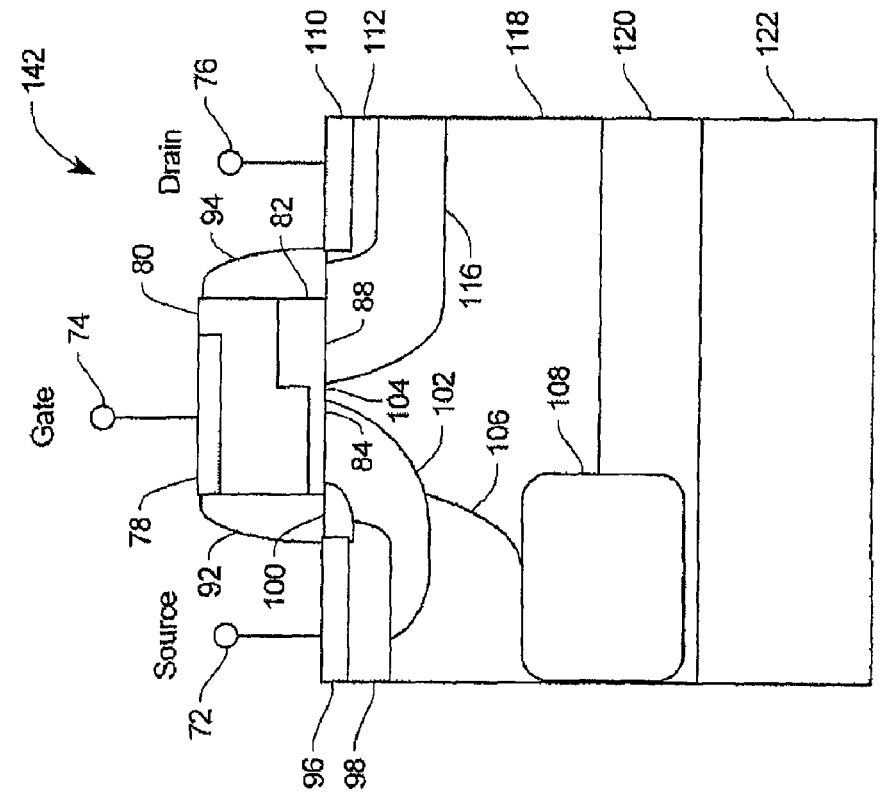
FIG. 6B is a diagrammatic view of a complementary p channel version of the integrated low voltage RF-LDMOS transistor shown in FIG. 6A.
Figure 6A:
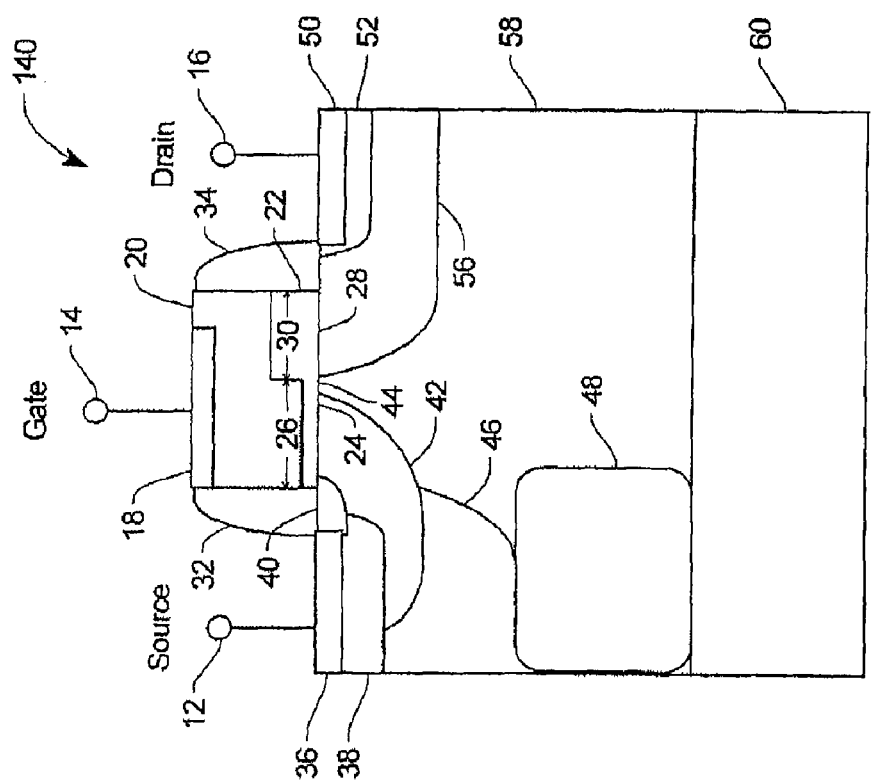
FIG. 6A is a diagrammatic view of an n channel integrated low voltage RF-LDMOS transistor according to yet another embodiment of the present invention.

FIGS. 6A and 6B are diagrammatic views of integrated low voltage RF-LDMOS transistors 140 and 142, respectively, according to yet another embodiment of the present invention. Transistor 140 is transistor 10 without the N buffer layer 54, and transistor 142 is transistor 70 without the P buffer layer 114. The removal of these layers 54, 114 allows a higher voltage rating for transistors shown in FIGS. 6A and 6B compared with the transistors shown in FIGS. 1A and 1B.

FIGS. 7A and 7B are diagrammatic views of integrated low voltage RF-LDMOS transistors 150 and 152, respectively, according to still another embodiment of the present invention in which the transistors 150 and 152 are surrounded by N isolation rings for isolated architectures. In FIG. 7A an N ring 154 has an isolation connection 156. The N ring 154 is connected by an N bridge 158 to a N– buried layer 160 which extends across the width of the transistor 150. A P– buried layer 162, which also extends across the width of the transistor 50, sits on top of the N– buried layer 160. In FIG. 7B an N ring 164 has an isolation connection 166. The N ring 164 is connected by an N bridge 168 to a N– buried layer 170 which extends across the width of the transistor 152. A P– buried layer 172 is built atop the N– buried layer 170 and connected to the P– well 46 as indicated schematically by connection 174 from the N– buried layer 172 to the source connection 72 which, in turn, provides a connection through the source silicide 96, and the source N+ tap 98 to the N– well 106.

Figure 8A:
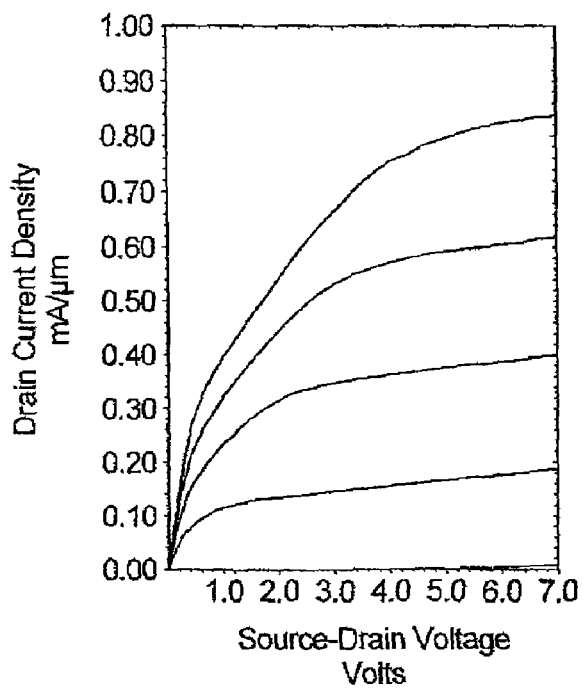
FIG. 8A is a graph of the drain characteristics versus drain voltage simulation of the transistor shown in FIG. 1A with a gate length of 0.35 micron.
Figure 8B:
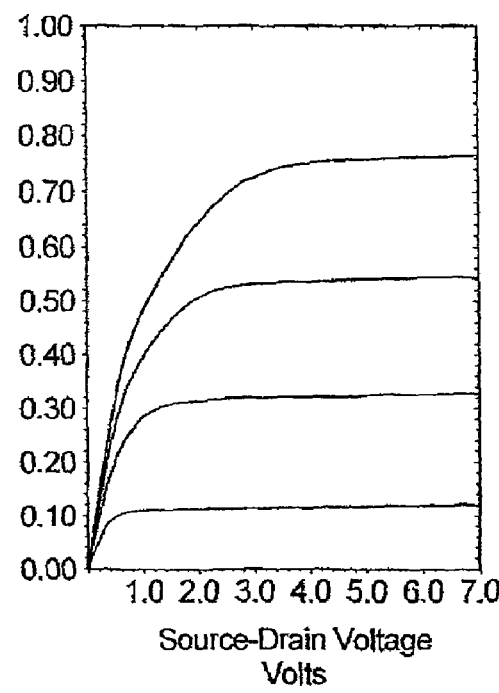
FIG. 8B is a graph of the drain characteristics versus drain voltage simulation of the transistor shown in FIG. 1A with a gate length of 0.50 micron.
Figure 9A:
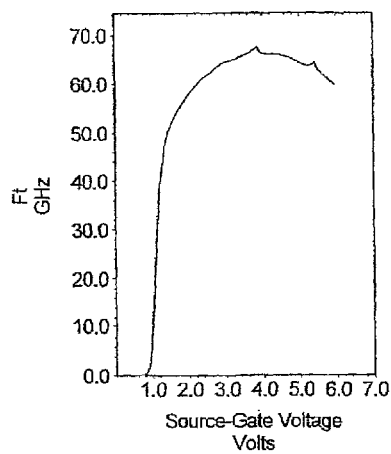
FIG. 9A is a graph of the frequency transition versus gate voltage simulation of the transistor shown in FIG. 1A with a gate length of 0.35 micron.
Figure 9B:
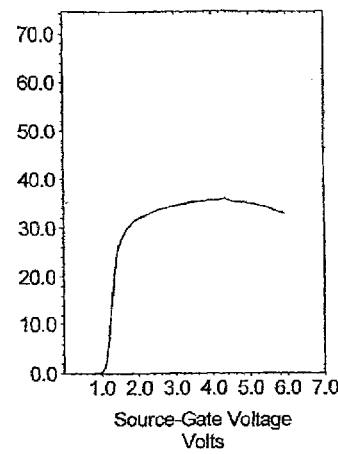
FIG. 9B is a graph of the frequency transition versus gate voltage simulation of the transistor shown in FIG. 1A with a gate length of 0.50 micron.
Figure 9C:
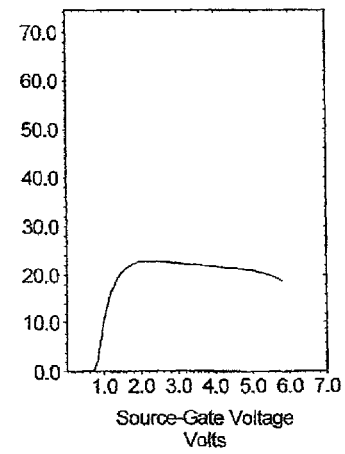
FIG. 9C is a graph of the frequency transition versus gate voltage simulation of a prior art transistor.
Figure 10A:
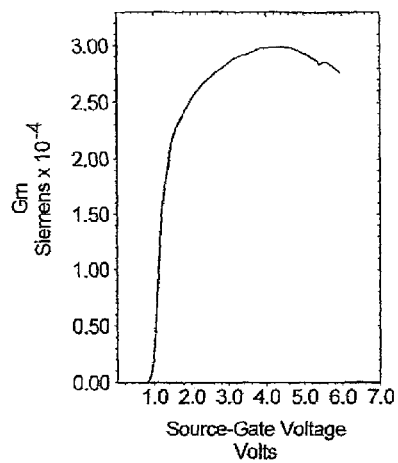
FIG. 10A is a graph of the transconductance versus gate voltage simulation of the transistor shown in FIG. 1A with a gate length of 0.35 micron.
Figure 10B:
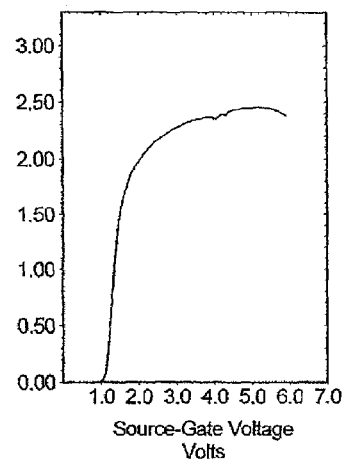
FIG. 10B is a graph of the transconductance versus gate voltage simulation of the transistor shown in FIG. 1A with a gate length of 0.50 micron.
Figure 10C:
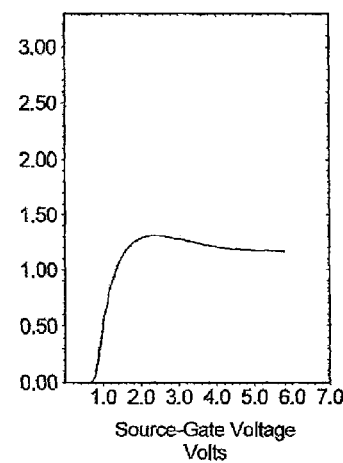
FIG. 10C is a graph of the transconductance versus gate voltage simulation of a prior art transistor.

FIGS. 8A-10C show 2-D simulated Si level operational characteristics of the transistor 10 and a prior art power NMOS transistor. FIGS. 8A, 9A, and 10A are simulations of transistor 10 with a thin gate width 26 of 0.20 μm. FIGS. 8B, 9B, and 10B are simulations of transistor 10 with a thin gate width 26 of 0.35 μm. The simulations which generated the A and B graphs were for the same thick gate width 30 of approximately 0.15 μm. FIGS. 8C, 9C, and 10C are simulations of the prior art power NMOS transistor.

FIGS. 8A, 8B, and 8C show the calculated drain characteristics for the respective transistors using a 2-D model. As can be seen transistor 10 with a 0.35 μm gate poly length has higher drain current densities than the 0.50 μm gate poly length transistor 10, which, in turn has higher drain current densities than the prior art lateral transistor.

FIGS. 9A, 9B, and 9C show the calculated frequency transitions (Ft) for the respective transistors. The peak Ft in FIG. 9A is 67 GHz, while the peak Ft in FIG. 9B is 36 GHz, and the peak Ft in FIG. 9C is 23 GHz.

FIGS. 10A, 10B, and 10C are the calculated transconductance Gm for the respective transistors. The peak Gm in FIG. 10A is $3\times10^{-4}$ siemens, while the peak Gm in FIG. 10B is $2.5\times10^{-4}$ siemens, and the peak Gm in FIG. 10C is $1.3\times10^{-4}$ siemens.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A method of making a LDMOS transistor comprising the steps of:
    growing an epi layer on a substrate;
    forming a gate electrode on a split gate oxide formed on said epi layer;
    forming a body of said first conductivity type and a source spacer of said second conductivity type which are self-aligned to first side of said polysilicon gate electrode; said second conductivity type being opposite to said first conductivity type;
    forming a first buffer layer of said second conductivity type self-aligned to a second edge of said polysilicon gate electrode;
    forming first and second side wall oxides on said first edge and said second edge, respectively, of said polysilicon gate electrode;
    forming a first drain region of said second conductivity type self-aligned to said second side wall oxide; and
    forming a source tap layer of said first conductivity type self-aligned to said first side wall oxide such that said source tap layer and said body overlap in a region spaced away from said first edge of said gate electrode, said source spacer region extending from said source tap layer to under at least said first edge of said polysilicon gate electrode.

2. The method set forth in claim 1 wherein said substrate is of said first conductivity type.

3. The method set forth in claim 1 wherein said substrate is of said second conductivity type.

4. The method set forth in claim 1 further including the step of forming a well of said second conductive type lying on said epi layer.

5. The method set forth in claim 1 further including the step of forming a buried layer lying on said epi layer.

6. The method set forth in claim 1 further including the step of forming a well of said first conductivity type under a least a portion of said body.

7. The method set forth in claim 6 further including the step of forming a first buried layer of said first conductivity type extending from said well towards a substrate.

8. The method set forth in claim 1 further including the step of forming a second buffer layer of said second conductivity type self-aligned to a second edge of said polysilicon gate electrode and lying below said first buffer.

9. The method set forth in claim 8 wherein the steps of forming said first buffer layer, said drain region, and said second buffer layer includes forming said drain layer with a higher dopant concentration than said first buffer layer which, in turn, is formed with a higher dopant concentration than said second buffer layer.

10. The method set forth in claim 1 further including the step of forming a second buffer layer of said first conductivity type self-aligned to a second edge of said polysilicon gate electrode and lying below said first buffer.

11. The method set forth in claim 10 wherein said second buffer region extends latterly and deeply under all of the thick section and part of the thin section of the split gate oxide to overlap the body region.

12. The method set forth in claim 1 further including the step of forming a buried layer of said first conductivity type lying on said epi layer.

13. The method set forth in claim 12 further including the step of forming a buried layer of said second conductivity type lying on said buried layer of said first conductivity type.

14. The method set forth in claim 1 further including the step of forming an isolation ring surrounding said transistor.

15. The method set forth in claim 14 wherein said isolation ring is connected to a region in said transistor which is the same conductivity type as said isolation ring.

16. The method of claim 1 wherein further comprising the steps of forming a second, complementary transistor including the steps of:
    forming a body of said second conductivity type and a source spacer of said first conductivity type which are self-aligned to first side of said polysilicon gate electrode;
    forming a first buffer layer of said first conductivity type self-aligned to a second edge of said polysilicon gate electrode;
    forming first and second side wall oxides on said first edge and said second edge, respectively, of said polysilicon gate electrode; forming a first drain region of said first conductivity type self-aligned to said second side wall oxide; and
    forming a source tap layer of said second conductivity type self-aligned to said first side wall oxide such that said source tap layer and said body overlap in a region spaced away from said first edge of said gate electrode, said source spacer region extending from said source tap layer to under at least said first edge of said polysilicon gate electrode.

17. The method set forth in claim 16 further including the step of forming a well of said second conductivity type under a least a portion of said body.

18. The method set forth in claim 16 further including the step of forming a second buffer layer of said second conductivity type self-aligned to a second edge of said polysilicon gate electrode and lying below said first buffer.

19. The method set forth in claim 16 further including the step of forming a second buffer layer of said first conductivity type self-aligned to a second edge of said polysilicon gate electrode and lying below said first buffer.

20. The method set forth in claim 19 wherein the steps of forming said first buffer layer, said drain region, and said second buffer layer includes forming said drain layer with a higher dopant concentration than said first buffer layer which, in turn, is formed with a higher dopant concentration than said second buffer layer.

21. The method set forth in claim 19 wherein said second buffer region extends latterly and deeply under all of the thick section and part of the thin section of the split gate oxide to overlap the body region.

* * * * *